United States Patent
Tetelbaum

(10) Patent No.: US 6,842,042 B2
(45) Date of Patent: Jan. 11, 2005

(54) GLOBAL CHIP INTERCONNECT

(75) Inventor: Alexander Tetelbaum, Hayward, CA (US)

(73) Assignee: LSI Logic Corporation, Milpitas, CA (US)

( * ) Notice: Subject to any disclaimer, the term of this patent is extended or adjusted under 35 U.S.C. 154(b) by 10 days.

(21) Appl. No.: 10/242,165

(22) Filed: Sep. 11, 2002

(65) Prior Publication Data

US 2004/0046588 A1 Mar. 11, 2004

(51) Int. Cl.$^7$ .................. H01L 25/00; H03K 19/003
(52) U.S. Cl. ................. 326/47; 326/15; 326/38
(58) Field of Search ................ 326/15, 17, 26, 326/101, 47, 82, 38

(56) References Cited

U.S. PATENT DOCUMENTS

| | | | |
|---|---|---|---|
| 5,436,573 A | * | 7/1995 | Ogawa et al. ............ 326/17 |
| 5,983,006 A | | 11/1999 | Carlson |
| 6,281,704 B2 | | 8/2001 | Ngai |
| 6,285,208 B1 | * | 9/2001 | Ohkubo .................. 326/15 |
| 6,456,117 B2 | * | 9/2002 | Tanaka .................. 326/101 |

OTHER PUBLICATIONS

*Direct Rambus™ ASIC Package Selection Guide Version 0.1*, Rambus, Inc., Nov. 1999 pp. 1–18.

* cited by examiner

*Primary Examiner*—Daniel D. Chang
(74) *Attorney, Agent, or Firm*—Sawyer Law Group LLP

(57) ABSTRACT

A global interconnect distribution system is disclosed. The global interconnect distribution system includes a global interconnect cell capable of producing at least two substantially identical output signals, and a global interconnect coupled to the cell for carrying one of the output signals. At least one wire is also coupled to the cell that is routed adjacent to the global interconnect for carrying the other output signal to provide active shielding for the global interconnect, thereby increasing signal integrity and signal transmission of the global interconnect.

18 Claims, 5 Drawing Sheets

GLOBAL CHIP INTERCONNECT

FIELD OF THE INVENTION

The present invention relates to ASIC design and implementation, and more particularly to a method for implementing global interconnects.

BACKGROUND OF THE INVENTION

Metal interconnects connect gates and other devices in electronic circuitry, and are having an increasing large role in ASICS (Application Specific Integrated Circuit) in terms of performance and manufacturing. In deep sub-micron ASIC design, for instance, interconnects are overtaking the transistor as being the dominant factor affecting performance. That is, full performance of an ASIC design cannot be realized if the metal interconnects comprising the circuits are not optimized.

Global chip interconnects, for example, are critically important signal lines comprising a circuit. Global interconnects form the critical connections of the circuit and may have long lengths (usually more than 3 mm). Example uses of global interconnects include long inter-block wires, busses, and clock nets.

There are three main signal integrity problems to be addressed for global interconnects. The first problem is signal delay minimization; the second problem is signal ramptime (slop) minimization; and the third problem is parasitic (coupling) impact from other wires. Designers have attempted to address each of these problems using varying approaches.

FIG. 1 is a diagram illustrating a conventional approach for addressing signal delay minimization. Typically, one or more buffers 12 (or inverters) are inserted into the global interconnect 10. Another approach has been to increase the wire width, or a combination of both. Buffer insertion speeds up the interconnect, but only untill some particular number of buffers is inserted. Buffers 12 also reduce ramptimes, and the global interconnect 10 becomes less sensitive to influence of other wires.

FIG. 2 is a diagram illustrating a conventional approach for addressing parasitic problem. In this approach, guard wires 14 are placed on one or both sides of the global interconnect 10 and other signal traces to protect against influence of other wires, or to increase the spacing between wires, or both. The guard wires 14 are connected to either power or ground, and are therefore referred to as passivie shielding (i.e., no signal is transmitted across the wires).

Both approaches described above can be combined. For example, FIG. 3 is a diagram showing additional buffers 12 inserted on a global interconnect 10, plus the use of passive shielding guard wires 14.

The main drawback of the use of buffers 12 is that buffers have internal delays and, thus, the signal delay across the global interconnect 10 cannot be decreased more than about two times. Another limitation of buffers 12 is that often a device includes macro blocks, which are pre-designed blocks of circuits. In some designs, a top (chip) level global interconnect 10 or other wire is routed over a hard macro block in a metal layer on top of the metal layers used for the hard macro block. However, buffers cannot be inserted in this wire because buffers cannot be placed (implemented) within hard macro blocks.

There are other approaches for addressing signal integrity issues. For example, some have attempted to address the signal delay problem using boosters. In this approach, a special additional circuit (booster) used to enhance the signal across the global interconnect 10. The booster, however, is complex and must be connected to the original interconnect 10. In addition, this approach does not address the problem of parasitic impact.

One approach for addressing the parasitic problem is the use of differential signals. This is a complex approach requiring two lines of signals, complex drivers and receiver cells, special connectors, and usually guard wires as well. For example, U.S. Pat. No. 6,293,827 describes special connectors for differential signals. Although useful, this approach does not solve the problem of parasite impact.

Accordingly, what is needed is an improved distribution system for global interconnect that increases the signal integrity. The present invention addresses such a need.

SUMMARY OF THE INVENTION

Figure 1:
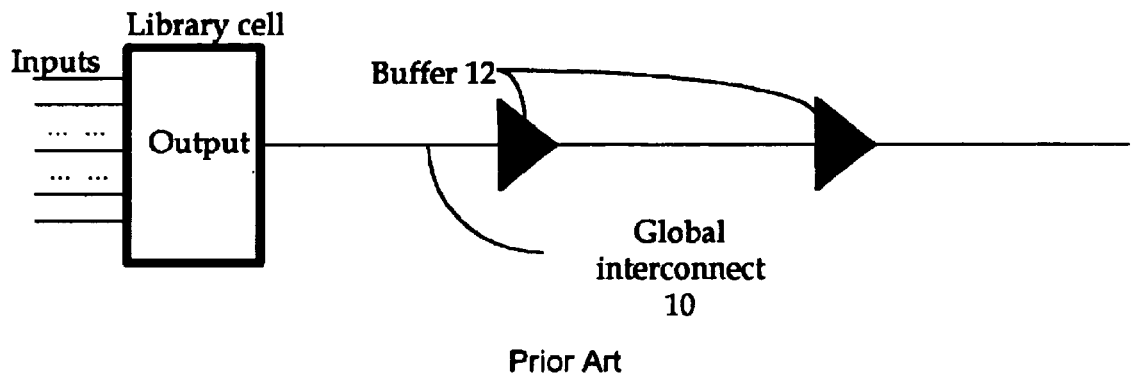
FIG. 1 is a diagram illustrating a conventional approach for addressing signal delay minimization.
Figure 2:
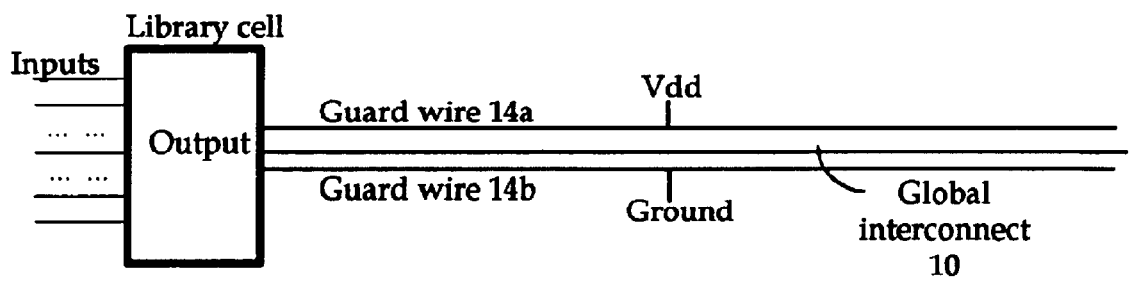
FIG. 2 is a diagram illustrating a conventional approach for addressing parasitic problem.
Figure 3:
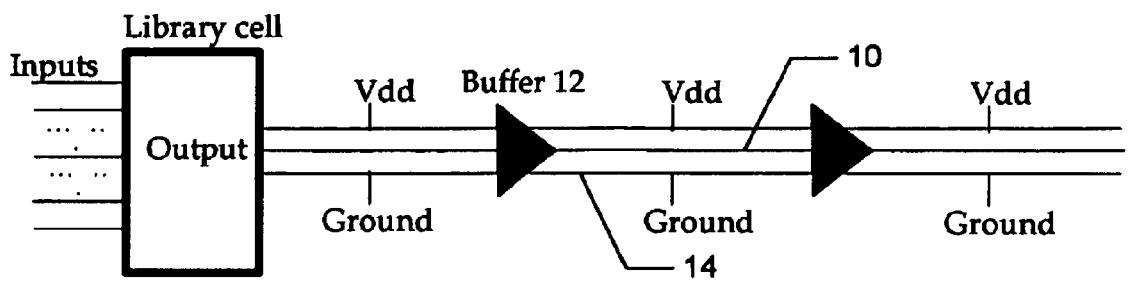
FIG. 3 is a diagram showing additional buffers inserted on a global interconnect, plus the use of passive shielding guard wires.

The present invention provides a global interconnect distribution system. The global interconnect distribution system includes a global interconnect cell capable of producing at least two substantially identical output signals, and a global interconnect coupled to the cell for carrying one of the output signals. At least one wire is also coupled to the cell that is routed adjacent to the global interconnect for carrying the other output signal to provide active shielding for the global interconnect.

According to the method and system disclosed herein, because the active shielding wires carry the same signal as the global interconnect, the active shielding wires significantly increase the transmission of the global interconnect and reduces ramptime. In addition, the active shielded wires protect the global interconnect from impact of other signals better than passive guard wires, thereby increasing signal integrity.

DETAILED DESCRIPTION

The present invention relates to an implementation for global interconnects. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for increasing the signal integrity of global interconnects. More specifically, the present invention provides active shielding guard wires adjacent to the global interconnect, rather than passive shielding, to address all three signal integrity problems described above. According to the present invention, an active shielded wire is one that is patterned adjacent to a global interconnect and driven in the same way as the global interconnect to carry a signal that is substantially the same as the global interconnect. In a preferred embodiment, the active shielding comprises two guard wires that are placed on opposite sides of the global interconnect and coupled to the same cell as the the global interconnect, instead of Power (Vdd) and Ground (Vss). The cell may be implemented with three identical outputs, one for the global interconnect and one for each of the active shielded wires, or a single output coupled to all three wires that has a three times more powerful driver.

In addition to increasing the signal integrity, the active shielding guard wires can increase signal transmission of the global interconnects up to ten times and therefore decrease signal delay up to ten times. In a further embodiment, a mixture of active and passive shielding may be used for precise tuning of the net delay across clock nets to minimize the clock skew. The active shielding of the present invention uses smaller resources (chip area and power consumption) than the conventional use of buffer insertion and passive shielding or wide wire and additional spacing.

Figure 4:
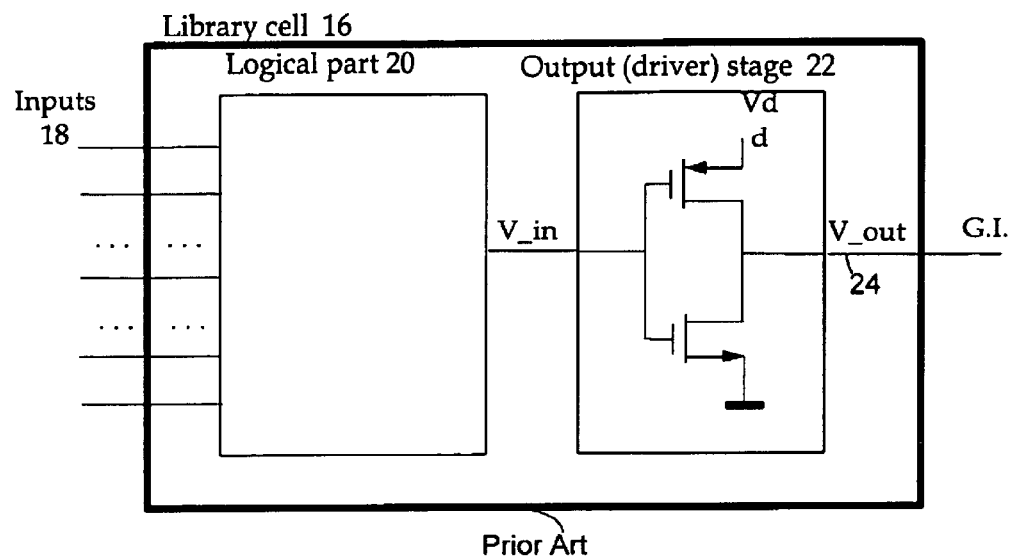
FIG. 4 is a diagram illustrating a conventional library cell used in chips.

Before describing the details of the present invention, a brief overview of the conventional cells that drive global interconnects will be given. FIG. 4 is a diagram illustrating a conventional library cell 16 used in chips. A typical cell 16 includes cell inputs 18, a logical part 20 for implementing the function of the cell 16, and an output stage 22 for transmitting an output signal (V-out) 24. Typically, the output stage comprises an amplifier, as shown.

Figure 5:
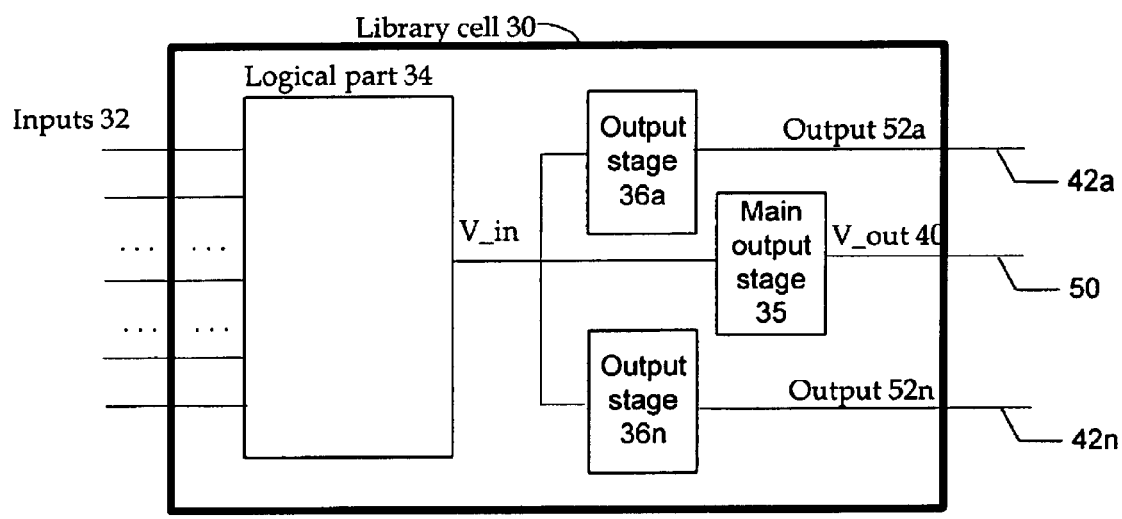
FIG. 5 is a diagram illustrating a cell for implementing a global interconnect and active shielding guard wires in one preferred embodiment of the present invention.

FIG. 5 is a diagram illustrating a cell for implementing a global interconnect and active shielding guard wires in one preferred embodiment of the present invention. One example of such a global interconnect cell 30 is a CMOS library cell. The cell 30 includes cell inputs 32, and a logical part 34 for implementing the function of the cell 30. In accordance with the present invention, the cell has multiple output stages 35 and 36 coupled to the logical part 34, rather than having a single output stage. The output stages, which are preferably identical, include a main output stage 35 for driving the output signal (V-out) 40 across the global interconnect 50, and N output stages 36A–36N. The ouput stages 36 drive output signals 52A–52N that are substantially identically to V-out 40 (i.e, having the same transitions etc.) to provide N active shielded wires 42A–42N.

Figure 6:
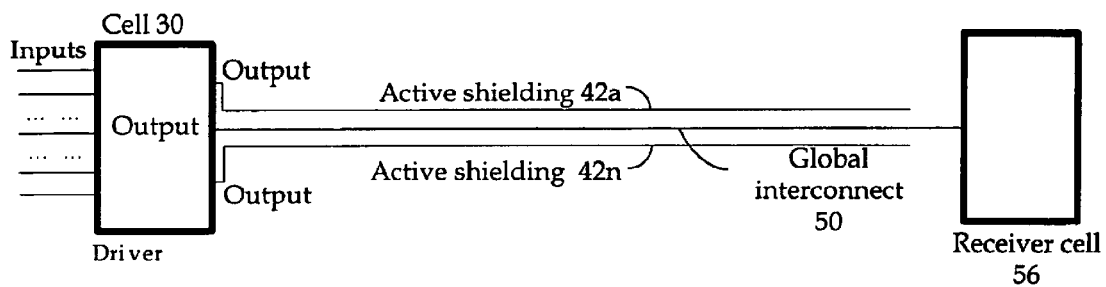
FIG. 6 is a diagram illustrating the multiple output stage cell and active shielding of the global interconnect

FIG. 6 is a diagram illustrating the multiple output stage cell and active shielding of the global interconnect. In this example, two active shielding 42A and 42N are shown coupled to the multiple output stage cell 30 and laid-out along opposite sides of the global interconnect 50.

Figure 7:
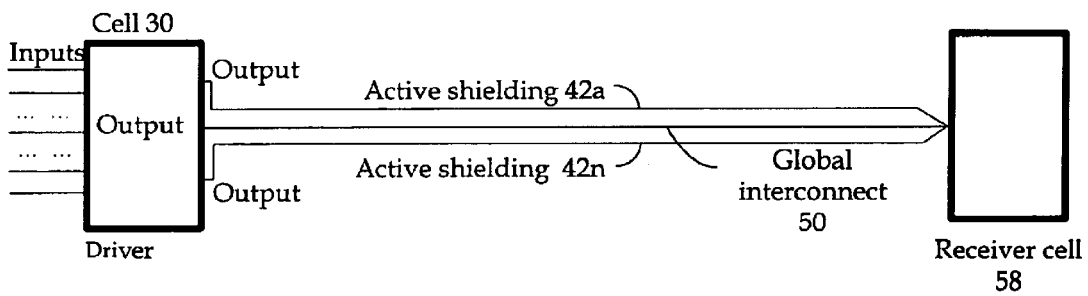
FIG. 7 is a diagram illustrating an alternative embodiment where the active shielding wires have hooked wire ends to connect at the save input of the receiver cell as the global interconnect.

Wire 50 is input in to a receiver cell 56, while active shielding wires 42 simply terminate. FIG. 7 is a diagram illustrating an alternative embodiment where the active shielding wires 42 have hooked wire ends to connect at the save input of the receiver cell 58 as the global interconnect 50. Because the active shielding wires 42 carry the same signal as the global interconnect 50, the active shielding wires 42 inject impulses into the global interconnect 50 that are aligned with the signal transistions of the global interconnect 50. This significantly increases the transmission speed of the global interconnect 50 and reduces ramptimes. In addition, the active shielded wires 42 protect the global interconnect 50 from impact of other signals better than passive guard wires, thereby increasing signal integrity.

Figure 8:
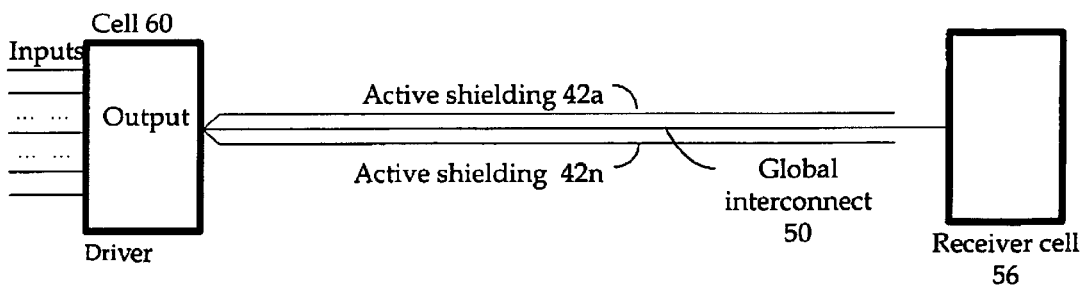
FIG. 8 is a block diagram showing the coupling of the global interconnect and active shielding wires to a single output stage cell.
Figure 9:
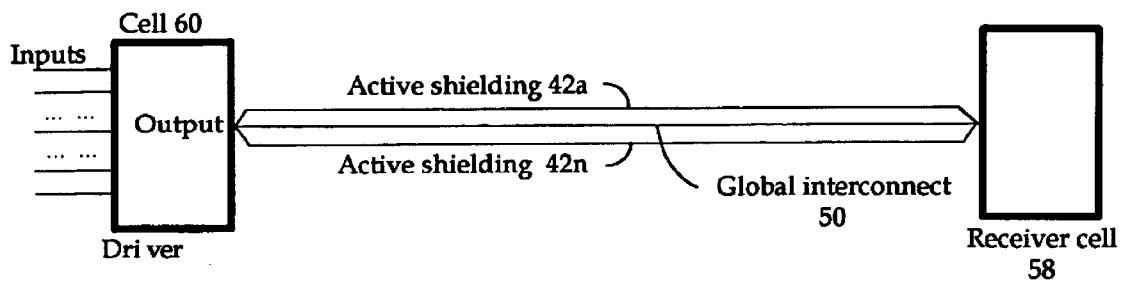
FIG. 9 is a block diagram showing a further embodiment, where both the front and end of the active shielding wires have hooked ends.

In an alternative embodiment, global interconnect cells may be implemented that have a single output stage coupled to the global interconnect, but with an M times more powerful driver, where M is the total number of wires (global interconnect plus the active shielded wires) being driven. FIG. 8 is a block diagram showing the coupling of the global interconnect 50 and active shielding wires 42 to a single output stage cell 60. In this example M=3. In this embodiment, the active shielding wires 42 have hooked wire ends so that all three wires 42 and 50 can be coupled to the 3x output driver stage of the cell 60. Here, all three wires 42 and 50 carry V-out. FIG. 9 is a block diagram showing a further embodiment, where both the front and end of the active shielding wires 42 have hooked ends. The hooked end of the wires 42 are connected to the same input of a receiver cell 58 as the global interconnect 50.

Although the present invention has beed described in terms of a preferred embodiment where two active shielding wires 42 have been used, it should be understood that the present invention may be used with structures having any number (1, 2, 3, . . . n) of active shielding wires 42.

Figure 10:
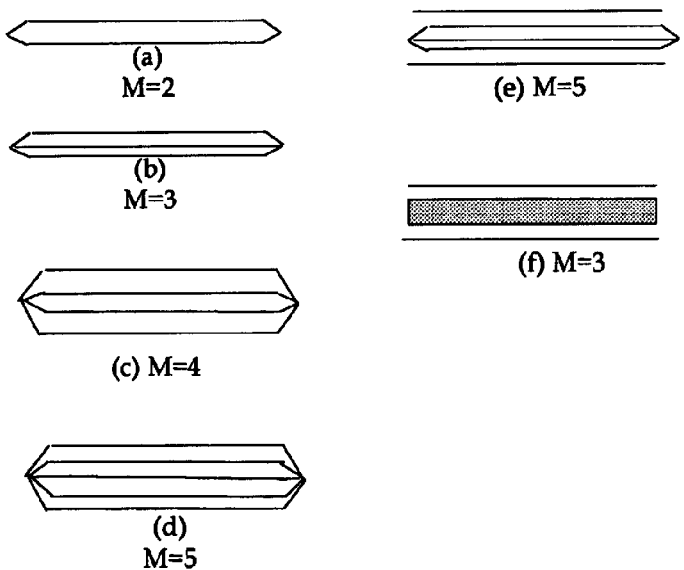
FIGS. 10(a–f) are block diagrams illustrating example combinations of active shielding wires.

FIGS. 10(a–f) are block diagrams illustrating example combinations of active shielding wires 42. FIGS. 10(a–d) show combinations of active shielding wires 42 having both hooked front and end structures. FIG. 10(e) shows a combination of two sets of hooked active shielding wires 42 on either side of a global interconnect, where the active shielding wire closest to the global interconnect 50 have hooked wires. FIG. 10(f) shows a wide global interconnect surrounded by two active shielding wires 42.

Figure 11:
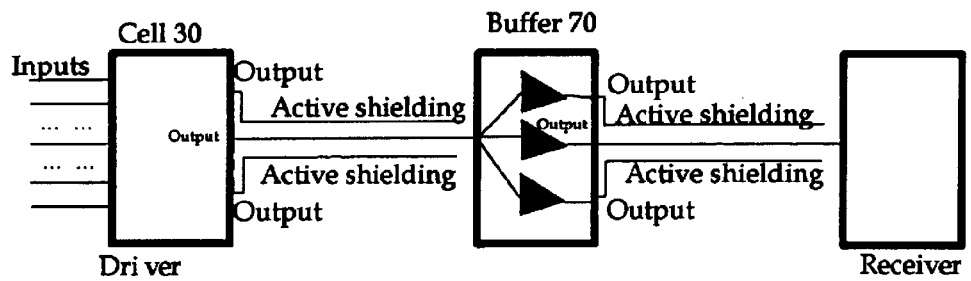
FIG. 11 is a diagram showing another embodiment of the present invention, where active shielding wire structures are used with buffer insertion

FIG. 11 is a diagram showing another embodiment of the present invention, where active shielding wire structures 42 are used with buffer insertion. Note that in this case, a buffer 70 with N(3) identical outputs is needed (the same as described for the cell 30).

Figure 12:
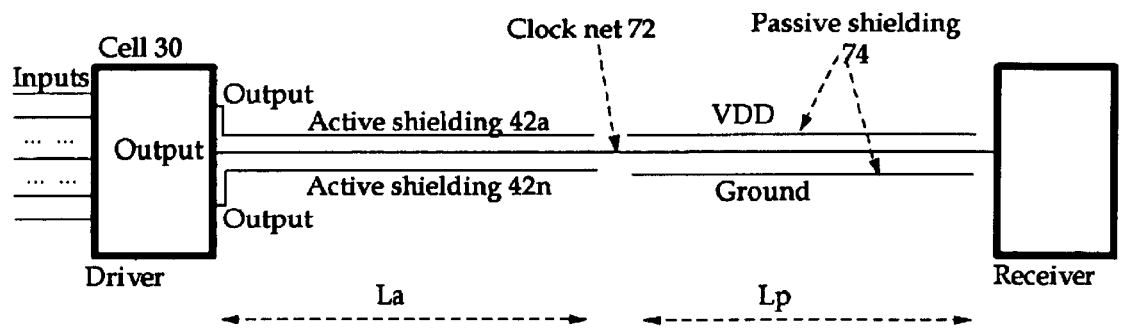
FIG. 12 is a diagram illustrating a further embodiment of the present invention, where a combination of active and passive shielding is used for guard wires to protect clock nets and for precise tuning of the net delay

FIG. 12 is a diagram illustrating a further embodiment of the present invention, where a combination of active and passive shielding is used for guard wires to protect the clock nets 72 and for precise tuning of the net delay. This can be used to minimize the clock skew. Active shielding wires 42 are patterned along the clock net 72 for a length of La, and passive shielding 74 is patterned along the clock net 72 for a length of Lp. According to the present invention, La and Lp may be changed as needed to allow precise and graduate tuning of the clock net delays.

A method and system for distributing global interconnects has been disclosed. The present invention provides global interconnect cells capable of producing multiple identical output signals, and connects guard wires to the outputs of these cells to provide active shielding wires, rather than passive shielding. The active shielding wires may decrease the signal delay in global interconnects up to 10× using smaller resources compared to buffer insertion (if possible at all over hard macro blocks) and passive shielding. This is due to the fact that additional buffers take more chip area and consume more power than additional two output stages. The chip area for active shielding is also less, because there is no need to connect wires to power (Vdd) and ground. The present invention also has better ramptime and better protection from cross talk. Also, a combination of active and passive shielding allows a precise and graduate tuning of clock delays for clock skew minimization.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A global interconnect distribution system, comprising:
   a global interconnect cell capable of producing at least two substantially identical output signals;
   a global interconnect coupled to the cell for carrying one of the output signals;
   at least one wire coupled to the cell that is routed adjacent to the global interconnect for carrying the other output signal to provide active shielding for the global interconnect, wherein the cell includes at least two output stages for generating the substantially identical output signals, wherein the global interconnect is coupled to a first one of the output stages and the active shielding wire is coupled to a second one of the output stages; and
   at least one passive shielding wire patterned adjacent to the global interconnect, thereby increasing signal integrity and signal transmission of the global interconnect.

2. The distribution system of claim 1 wherein the cell includes multiple output stages for driving the global interconnect and multiple active shielding wires.

3. The distribution system of claim 2 further including first and second active shielding wires on opposite sides of the global interconnect.

4. The distribution system of claim 3 further including a buffer along the global interconnect and the active shielding wires.

5. The distribution system of claim 4 wherein the buffer includes multiple substantially identical outputs.

6. The distribution system of claim 1 wherein a combination of active and passive shielding wires is used to protect clock nets for tuning of a net delay.

7. The distribution system of claim 6 wherein active shielding is patterned along the wire for a length of La, and passive shielding is patterned along the wire for a length of Lp, wherein La and Lp may be changed to allow tuning of clock net delays.

8. The distribution system of claim 1 wherein the cell includes a single output stage that is capable of generating the substantially identical output signals, and coupling the global interconnect and the active shielding wire to the output stage.

9. The distribution system of claim 8 wherein the active shielding wire includes a hooked front end.

10. A method for distributing global interconnects comprising the steps of:
    (a) providing a global interconnect cell capable of producing at least two substantially identical output signals;
    (b) coupling a global interconnect to the cell for carrying one of the output signals;
    (c) coupling at least one wire to the cell that is routed adjacent to the global interconnect for carrying the other output signal to provide active shielding for the global interconnect, thereby increasing signal integrity and signal transmission of the global interconnect wherein the cell includes at least two output stages for generating the substantially identical output signals, wherein the global interconnect is coupled to a first one of the output stages and the active shielding wire is coupled to a second one of the output stages; and
    (d) coupling at least one passive shielding wire adjacent to the global interconnect.

11. The method of claim 10 further including the step of: providing the cell with multiple output stages for driving the global interconnect and multiple active shielding wires.

12. The method of claim 11 further including the step of: providing first and second active shielding wires on opposite sides of the global interconnect.

13. The method of claim 10 further including the step of: providing a buffer along the global interconnect and the active shielding wires.

14. The method of claim 13 further including the step of: providing the buffer with multiple substantially identical outputs.

15. The method of claim 10 further including the step of: using the combination of active and passive shielding wires to protect clock nets for tuning of a net delay.

16. The method of claim 15 further including the step of: patterning active shielding along the wire for a length of La, and patterning passive shielding along the wire for a length of Lp, wherein La and Lp may be changed to allow tuning of clock net delays.

17. The method of claim 10 further including the step of: providing the cell with a single output stage that is capable of generating the substantially identical output signals, and coupling the global interconnect and the active shielding wire to the output stage.

18. The method of claim 17 further including the step of: proving the active shielding wire with a hooked front end.

* * * * *